(12) United States Patent
Yao et al.

(10) Patent No.: US 11,894,825 B2
(45) Date of Patent: Feb. 6, 2024

(54) PASSIVE ACTIVE HYBRID LC FILTER

(71) Applicant: Apple Inc., Cupertino, CA (US)

(72) Inventors: Xi Yao, San Diego, CA (US); Hao Xu, Shanghai (CN); Pengbei Zhang, San Diego, CA (US); Aly Mohamed Mamdouh Ismail, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/840,093

(22) Filed: Jun. 14, 2022

(65) Prior Publication Data
US 2023/0402986 A1 Dec. 14, 2023

(51) Int. Cl.
| | |
|---|---|
| *H03H 7/01* | (2006.01) |
| *H03H 7/06* | (2006.01) |
| *H03H 7/075* | (2006.01) |
| *H03H 11/12* | (2006.01) |
| *H04B 1/18* | (2006.01) |

(52) U.S. Cl.
CPC ........ *H03H 7/1741* (2013.01); *H03H 7/0115* (2013.01); *H03H 7/06* (2013.01); *H03H 7/075* (2013.01); *H03H 11/12* (2013.01); *H04B 1/18* (2013.01)

(58) Field of Classification Search
CPC ...... H03H 7/1741; H03H 7/06; H03H 7/0115; H03H 2/006

USPC ........................................ 333/175, 176, 172
See application file for complete search history.

(56) References Cited

U.S. PATENT DOCUMENTS

| | | | |
|---|---|---|---|
| 7,349,465 B2 * | 3/2008 | Mangino ............. | H04L 25/0272 375/220 |
| 2008/0312523 A1 | 12/2008 | Dunseath | |

FOREIGN PATENT DOCUMENTS

| | | |
|---|---|---|
| EP | 224585 A1 | 6/1987 |
| EP | 3512094 A2 | 7/2019 |

* cited by examiner

Primary Examiner — Rakesh B Patel
(74) Attorney, Agent, or Firm — FLETCHER YODER PC (57) ABSTRACT

This disclosure is directed to filtering in a transceiver of an electronic device. In some instances, active analog filters may be deployed in the transceiver of the electronic device to achieve greater linearity and/or reduce noise in the transceiver. However, as signal bandwidth grows increasingly larger, an active analog filter may consume excessive power. To remedy the excessive power consumption, a passive ladder LC filter may be used. Some LC ladder filters may include a limited quality factor (Q), which may lead to undesirable effects in the transceiver (e.g., voltage droop). To address these undesirable effects, certain components in the LC ladder filter may be relocated from an input port to a feedback chain of an amplifier coupled to the LC ladder filter. The new structure may enable components in the LC ladder filter to be tuned without causing additional voltage droop across the LC ladder filter.

20 Claims, 7 Drawing Sheets

PASSIVE ACTIVE HYBRID LC FILTER

BACKGROUND

The present disclosure relates generally to wireless communication, and more specifically to frequency filtering in a transceiver.

In certain electronic devices, active analog filters may be deployed to filter undesired frequency components with greater linearity and/or decreased noise in the transceiver. However, as signal bandwidth grows, such as in the case of $5^{th}$ generation and/or New Radio cellular applications, an active analog filter may consume excessive power. As such, a passive filter may be implemented to decrease power consumption. However, some components of a passive filter may affect a quality factor (Q) of the transceiver, which may lead to undesirable results, such as voltage droop across the transceiver.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, receiver filter circuitry may include an amplifier, a first inductor coupled to a first input port of the receiver filter circuitry and a first input port of the amplifier, a second inductor coupled to a second input port of the receiver filter circuitry and a second amplifier input port of the amplifier, and a first capacitor coupled to the first input port and the second input port. The receiver filter circuitry may include a second capacitor coupled to the first amplifier input port and a first amplifier output port of the amplifier, a first resistor coupled to the first amplifier input port and the first amplifier output port, a third capacitor coupled to the second amplifier input port and a second amplifier output port, and a second resistor coupled to the second amplifier input port and the second amplifier output port.

In another embodiment, an electronic device may include one or more antennas, a transmitter coupled to the one or more antennas, and a receiver coupled to the one or more antennas, the receiver including filter circuitry that may include an amplifier, a first inductor and a first resistor coupled in series to a first input port of the filter circuitry, wherein the first inductor and the first resistor may adjust a complex pole of the filter circuitry, and a second inductor and a second resistor coupled in series to a second input port of the filter circuitry, wherein the second inductor and the second resistor may adjust the complex pole of the filter circuitry. The filter circuitry may also include a first capacitor coupled in parallel to the first input port and the second input port, the first capacitor may adjust the complex pole of the filter circuitry, a third resistor coupled in parallel to the amplifier, wherein the third resistor may adjust a real pole of the filter circuitry, a second capacitor coupled in parallel to the third resistor and the amplifier, the second capacitor may adjust the real pole of the filter circuitry, a fourth resistor coupled in parallel to the amplifier, wherein the fourth resistor may adjust the real pole of the filter circuitry, and a third capacitor coupled in parallel to the fourth resistor and the amplifier, wherein the third capacitor may adjust the real pole of the filter circuitry.

In yet another embodiment, a transceiver filter circuitry may include an amplifier, a first resistor coupled in series to a second input port of the transceiver filter circuit, a second resistor coupled in series to a second input port of the transceiver filter circuit, a first capacitor coupling the first resistor and the second resistor, a first inductor coupling the first resistor a first differential input of the amplifier, a second capacitor and a third resistor coupled in parallel to the first differential input and a first differential output of the amplifier, a second inductor coupling the second resistor and a second differential input of the amplifier, and a third capacitor and a fourth resistor coupled in parallel to the second differential input and a second differential output of the amplifier.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

The present disclosure relates to cellular communication, and particularly to frequency filtering in a transceiver of a cellular device. In some instances, active analog filters may be deployed in the transceiver of the cellular device to achieve greater linearity and/or reduce noise in the transceiver. However, as signal bandwidth grows, such as in the case of $5^{th}$ generation (5G) and/or New Radio (NR) cellular applications, an active analog filter may consume excessive power. To remedy the excessive power consumption, a passive ladder filter including inductors and capacitors (i.e., an LC filter) may replace the active analog filter. Active components may refer to those components that use a power source to operate, whereas passive components may refer to those components that may operate without an external power source.

An LC ladder filter may include series inductors which may affect a quality factor (Q) of the LC ladder filter. The limited quality factor of the series inductors may change the complex and real pole location from one or more desired locations, which may lead to undesirable effects in the operation of transceiver (e.g., voltage droop). It may be desirable in some instances to adjust a quality factor associated with a complex pole of a transfer function of the LC ladder filter. This may be accomplished by adjusting resistance and capacitance values associated with the complex pole. However, in some instances, adjusting resistance and/or capacitance in the LC ladder filter may change both a real pole and the complex pole of the transfer function. Adjusting the real pole of the transfer function may increase certain undesirable effects (e.g., may increase the voltage droop across the LC ladder filter).

In an embodiment, certain resistors and capacitors in such an LC ladder filter may be relocated from an input port to a feedback chain of an amplifier coupled to the LC ladder filter. The restructured LC ladder filter may separate the real pole and the complex pole of the transfer function of the LC ladder filter, such that the values of the resistors and capacitors in the feedback chain may only affect the real pole (and not the real pole), and the values of the resistors and capacitors on the input port may only affect the complex pole (and not the real pole). As such, the restructured LC ladder filter may enable adjusting the real and complex poles independently.

Figure 1:
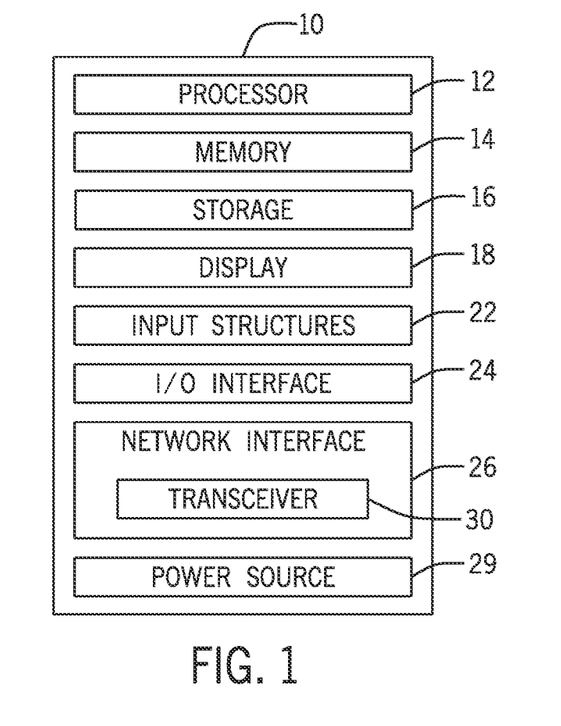
FIG. 1 is a block diagram of an electronic device, according to embodiments of the present disclosure.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a satellite network, a non-terrestrial network, and so on. In particular, the network interface 26 may include, for example, one or more interfaces for using a Release-15 cellular communication standard of the 5G specifications that include the millimeter wave (mmWave) frequency range (e.g., 24.25-300 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
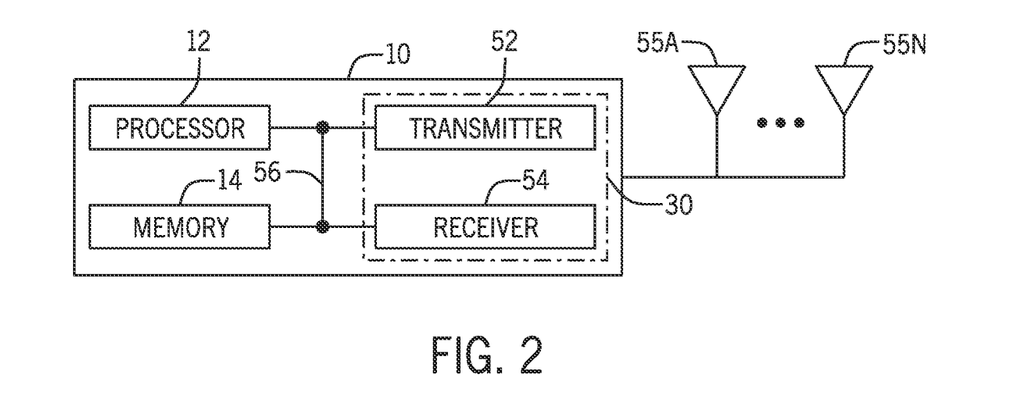
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
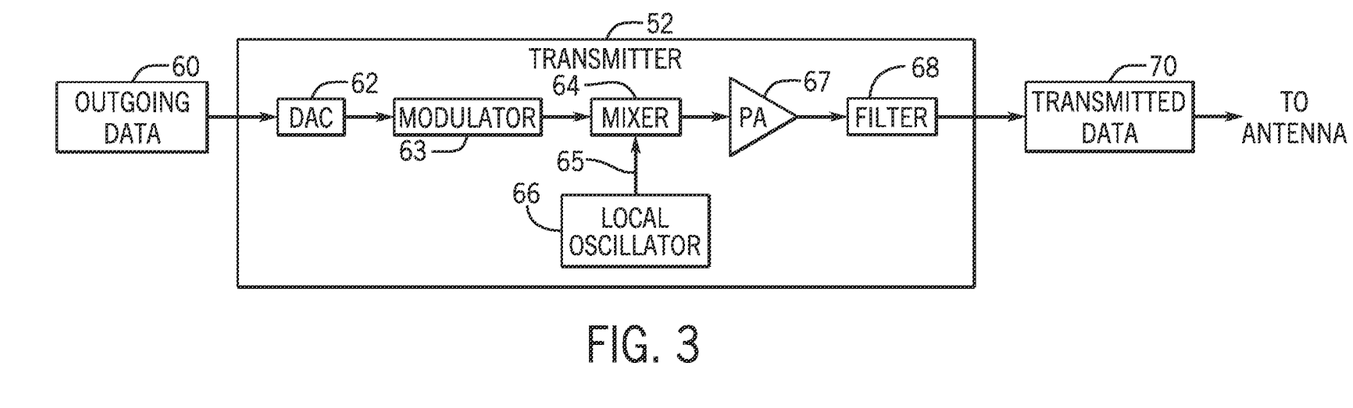
FIG. 3 is a schematic diagram of a transmitter of the electronic device of FIG. 1, according to embodiments of the present disclosure.

As mentioned above, the transceiver 30 of the electronic device 10 may include a transmitter and a receiver that are coupled to at least one antenna to enable the electronic device 10 to transmit and receive wireless signals. FIG. 3 is a block diagram of a transmitter 52 (e.g., transmit circuitry) that may be part of the transceiver 30, according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 63 may combine the converted analog signal with a carrier signal. A mixer 64 may combine the carrier signal with a local oscillator signal 65 from a local oscillator 66 to generate a radio frequency signal.

A power amplifier (PA) 67 receives the radio frequency signal from the mixer 64, and may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include an additional mixer and/or a digital up converter (e.g., for converting an input signal from a baseband frequency to an intermediate frequency). As another example, the transmitter 52 may not include the filter 68 if the power amplifier 67 outputs the amplified signal in or approximately in a desired frequency range (such that filtering of the amplified signal may be unnecessary).

Figure 4:
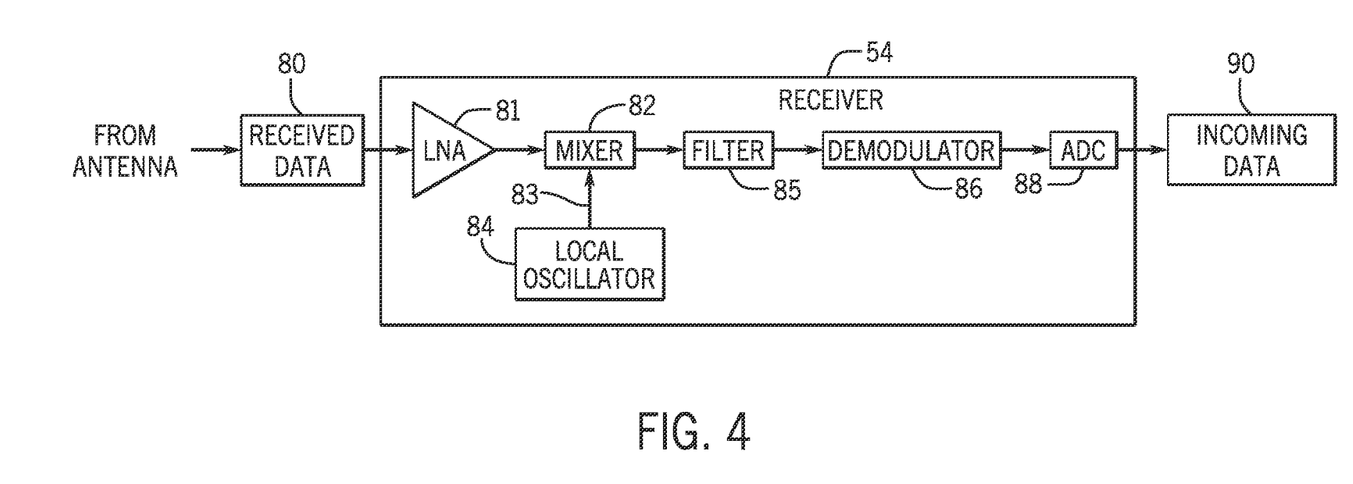
FIG. 4 is a schematic diagram of a receiver of the electronic device of FIG. 1, according to embodiments of the present disclosure.

FIG. 4 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may combine the amplified signal with a local oscillation signal 83 from a local oscillator 84 to generate an intermediate or baseband frequency signal.

A filter 85 (e.g., filter circuitry and/or software) may remove undesired noise from the signal, such as cross-channel interference. The filter 85 may also remove additional signals received by the one or more antennas 55 that are at frequencies other than the desired signal. The filter 85 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

Figure 5:
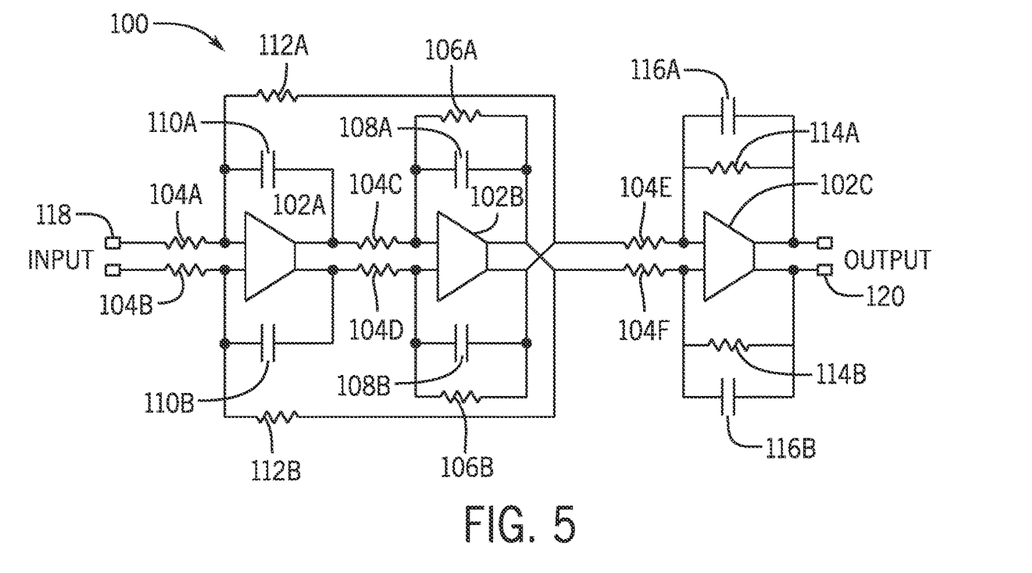
FIG. 5 is a circuit diagram of an active filter of a transceiver of an electronic device.

FIG. 5 is a circuit diagram of an active filter 100 that may be implemented in transceivers of certain electronic devices. The active filter 100 includes amplifiers 102A, 102B, and 102C (collectively 102) coupled in series with one another (e.g., the active filter 100 may have three amplifiers 102 and thus be a third-order filter) between a differential input 118 and a differential output 120 of the active filter 100. That is, the differential input 118 may receive a high input signal and a low input signal as inputs, and the differential output 120 may output a high output signal and a low output signal as outputs. The amplifiers 102A, 102B, and 102C may include operational amplifiers, such as differential operational amplifiers. The active filter 100 includes resistors 104A and 104B coupled an input of the amplifier 102A, resistors 104C and 104D coupled to an input at the amplifier 102B, and resistors 104E and 104F coupled to an input at the amplifier 102C. The active filter 100 includes feedback resistors 106A and 106B and feedback capacitors 108A and 108B coupled in parallel with the amplifier 102B. The active filter 100 also includes feedback capacitors 110A and 110B coupled in parallel with the amplifier 102A and feedback resistors 112A and 112B coupled in parallel with the amplifiers 102A and 102B. The active filter 100 further includes feedback resistors 114A and 114B and feedback capacitors 116A and 116B coupled in parallel with the amplifier 102C.

As previously stated, in some instances, one or more filters (e.g., 68, 85) in a transceiver of an electronic device may be active filters, such as the active filter 100, meaning that the active filter 100 may use power to operate. However, electronic devices (e.g., 10) communicating over certain cellular networks (e.g., 5G NR cellular networks) may use large bandwidths for uplink and downlink Filtering large bandwidths (e.g., greater than 500 megahertz (MHz), greater than 700 MHz, between 800 MHz and 1.4 gigahertz (GHz), and so on) may cause the active filter 100 to consume excessive power on the electronic device. As such, it may be beneficial to utilize one or more passive filters on the transceiver 30.

Figure 6:
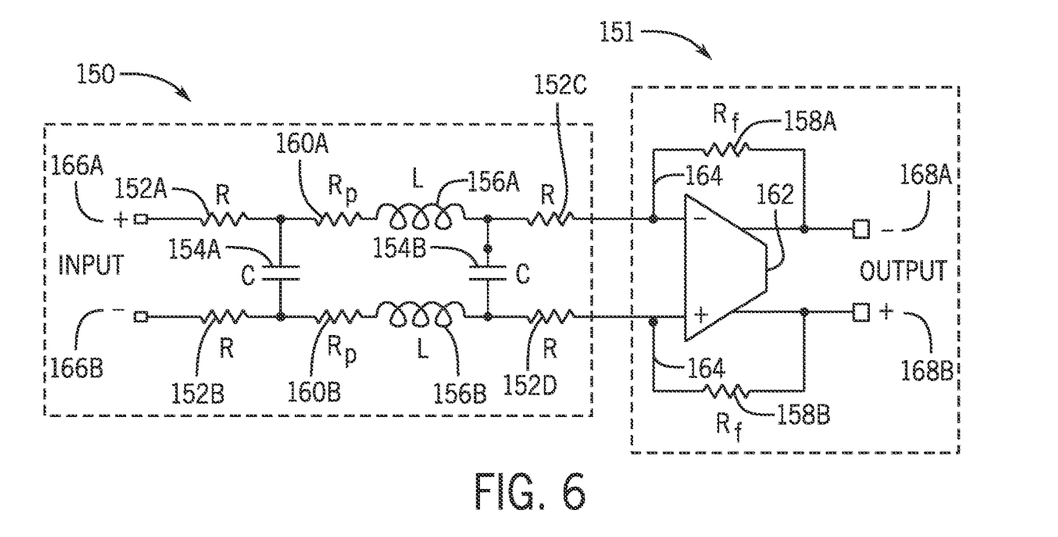
FIG. 6 is a circuit diagram of a passive filter and amplification stage that may be implemented in a transceiver of an electronic device.

FIG. 6 is a circuit diagram of a passive filter 150 and an amplification stage 151 that may be implemented in transceivers of certain electronic devices. The passive filter 150 may operate without receiving power from a power source (e.g., 29), and thus may consume significantly less energy than the active filter 100. The passive filter 150 includes resistors 152A, 152B, 152C, and 152D (collectively referred to herein as the resistors 152), capacitors 154A and 154B, and inductors 156A and 156B coupled to differential input branches 166A and 166B, which may together include the differential input port of the passive filter 150. That is, the passive filter 150 may include a differential input having a differential input branch 166A that may receive a high input signal and differential input branch 166B that may receive a low input signal as inputs, or vice versa. The resistor 152A is coupled to the differential input branch 166A in series with the inductor 156A and the resistor 152C. The resistor 152B is coupled to the differential input branch 166B in series with the inductor 156B and the resistors 152D.

The capacitor 154A is coupled in parallel between the resistor 152A and the inductor 156A on the differential input branch 166A and between the resistor 152B and the inductor 156B on the differential input branch 166B. The capacitor 154B is coupled in parallel between the inductor 156A and the resistor 152C on the differential input branch 166A and between the inductor 156B and the resistors 152D on the differential input branch 166B. Due to the quality factor of the inductors 156A and 156B, the inductors 156A and 156B may generate parasitic resistances represented by the parasitic resistors 160A and 160B. The passive filter 150 is electrically coupled to an amplification stage 151 of the transceiver 30. The amplification stage 151 may include an amplifier 162 and feedback resistor 158A coupled to a feedback chain 164 of the amplifier 162, in parallel to the amplifier 162, between differential output branch 168A and the differential input branch 166A. The amplifier 162 includes feedback resistor 158B coupled to the feedback chain 164 of the amplifier 162, coupled in parallel to the amplifier 162 between the differential output branch 168B and the differential input branch 166B. That is, the passive filter 150 may include a differential output having a differential output branch 168A that may output a high output signal and differential output branch 168B that may output a low output signal as outputs, or vice versa. As such, the amplifier 162 may include, but is not limited to, a differential amplifier, such as a differential operational amplifier.

Figure 7:
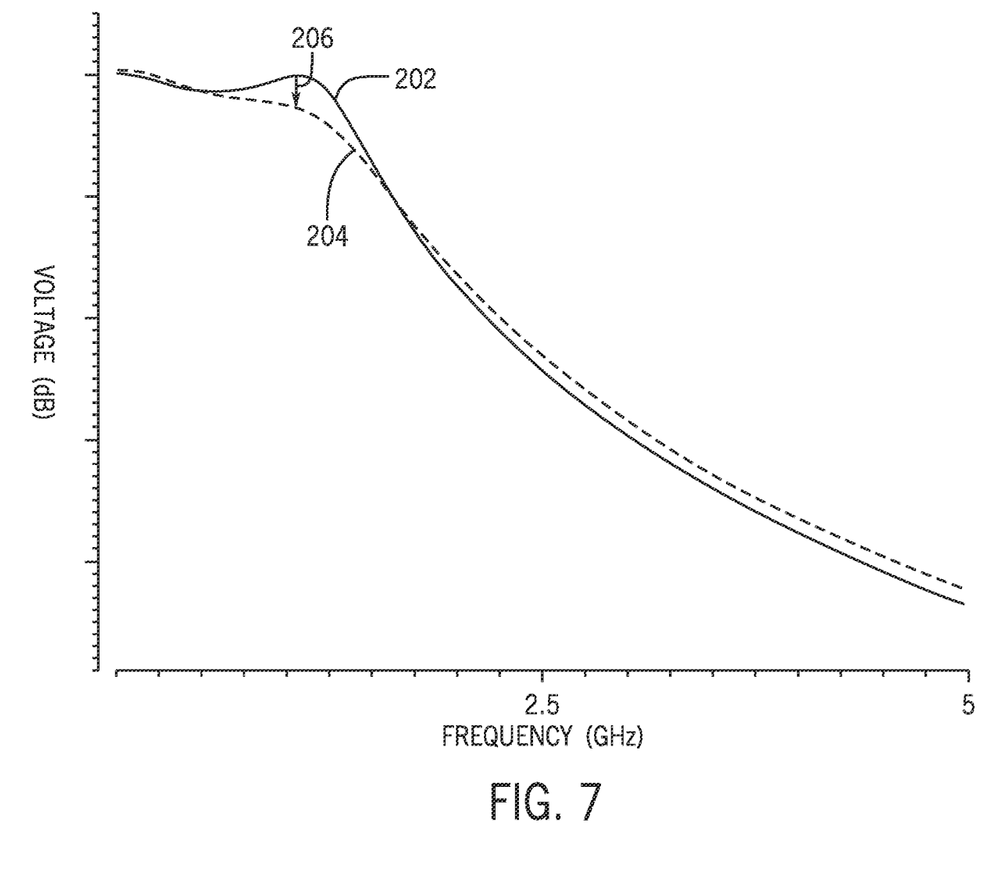
FIG. 7 is a plot illustrating voltage responses varying with frequency for an ideal passive filter and the passive filter of FIG. 6.

FIG. 7 is a plot illustrating voltage responses varying with frequency for an ideal passive filter and the passive filter 150 and the amplification stage 151 of FIG. 6. As illustrated, the plot includes a horizontal or x-axis representing frequency in terms of GHz and a vertical or y-axis representing voltage response or gain in terms of decibels (dB). In particular, the plot includes a voltage response 202 of an ideal passive filter and a voltage response 204 of the passive filter 150 and the amplification stage 151 of FIG. 6. As may be observed from the plot, the passive filter 150 may exhibit a voltage droop 206 across a certain frequency range (e.g., from 0.5 GHz to 2.125 GHz), such that the actual voltage across the passive filter 150 and/or the amplification stage 151 is less than that of the ideal filter for that frequency range, which indicates decreased performance of the passive filter 150 for at least for that frequency range.

The voltage droop 206 illustrated in FIG. 7 may be caused by a quality factor of the inductors 156A and 156B. For example, the quality factor associated with the inductors 156A and 156B may reduce the quality factor of a complex pole of a transfer function of the passive filter 150, causing the complex pole to move farther away from an imaginary axis, which may lead to greater voltage droop. A transfer function may express a relationship between system response characteristics. The transfer function may include poles and zeroes, which are properties of the transfer function, and may describe the input-output system dynamics of a passive filter (e.g., 150).

In some instances, adjusting the values of the components in the passive filter 150 (e.g., the resistors 152, the parasitic resistors 160A and 160B, the capacitors 154A and 154B, the inductors 156A and 156B, and/or the feedback resistors 158A and 158B) may adjust a complex pole of the transfer function. However, adjusting the values of the components in the passive filter 150 and/or the amplification stage 151 may move a location of a real pole along a real axis, which may result in undesirable effects in the passive filter 150, as will be discussed in greater detail below.

Figure 8:
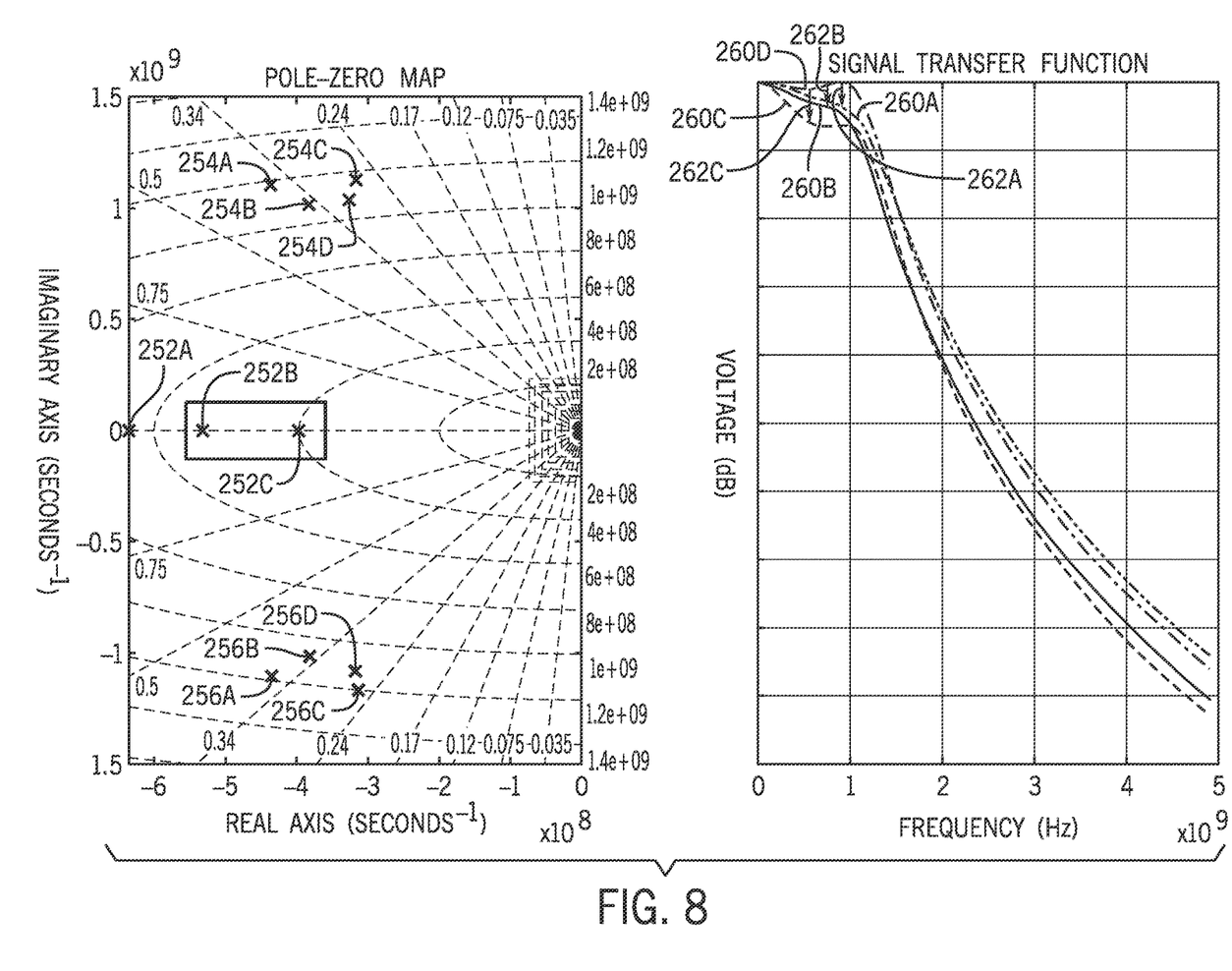
FIG. 8 includes a pole-zero map and a plot illustrating voltage responses varying with frequency for the passive filter of FIG. 6 in response to using various components in the passive filter.

FIG. 8 is a pole-zero map and a plot illustrating voltage responses 260A, 260B, 260C, and 260D (collectively referred to herein as the voltage responses 260) varying with frequency for the passive filter 150 and the amplification stage 151 in response to using various components in the passive filter 150 and/or the amplification stage 151. By adjusting the values of one or more of the resistors 152, the parasitic resistors 160A and 160B, the capacitors 154A and 154B, and/or the inductors 156A and 156B, the transfer function may include real poles 252A, 252B, or 252C, and complex poles 254A, 254B, 254C, and 254D and complex poles 256A, 256B, 256C, or 256D. However, by moving the real poles along the real axis (e.g., from the position illustrated by the real pole 252A to the positions illustrated by the real poles 252B and 252C), the voltage droop 262A, 262B, and 262C (collectively referred to herein as the voltage droop 262) across the passive filter 150 and/or the amplification stage 151 may increase. For example, the voltage response 260D may represent the voltage response of an ideal passive filter with no parasitic resistances (e.g., the parasitic resistors 160A and 160B are equal to 0 ohms (Ω)), wherein the resistors 152 have a resistance of at least 200Ω (e.g., 250Ω or more, 350Ω or more, 450Ω or more, 500Ω or more), the capacitors 154A and 154B each have a capacitance between 100 fF and 2 pF (e.g., 150 fF or more, 500 fF or more, 750 fF or more, 900 fF or more, 1 pF or more 1.5 pF or more, and so on, such as 1 pF), and the inductors 156A and 156B each have an inductance of 1 nanoHenry (nH) to 100 nH (e.g., 10 nH or less, 20 nH or less, 40 nH or less, 80 nH or less, and so on). In the ideal passive filter, the transfer function may be defined by Equation 1 below:

$$H(s) = \frac{1}{\left(s + \frac{1}{RC}\right)\left(s^2 + s\frac{1}{RC} + \frac{2}{LC}\right)} \quad \text{(Equation 1)}$$

In Equation 1, the variable s is a complex variable of the transfer function H(s), and is defined as $s = \sigma + j \cdot \omega$, which may reduce to $s = j \cdot \omega$ when $\sigma$ is zero, and where w represents angular frequency (measured in radians per second). Angular frequency ($\omega$) may be defined as $\omega = 2\pi f$, where f represents frequency (measured in hertz (Hz)). As such, s varies proportionally to the frequency f of a signal (e.g., a signal provided to the passive filter 150). The variable R is the resistance due to the resistors 152, the variable C is the capacitance of the system (e.g., due to the capacitors 154A and 154B), and the variable L is the inductance of the system (e.g., due to the inductors 156A and 156B). The function $$\frac{1}{\left(s + \frac{1}{RC}\right)}$$

in Equation 1 affects the real pole of the transfer function H(s), while the function $$\frac{1}{\left(s^2 + s\frac{1}{RC} + \frac{2}{LC}\right)}$$

affects the complex pole of the transfer function H(s). As may be appreciated, as both functions of Equation 1 include the same R and C variables, changing the resistance or capacitance values in the passive filter 150 affects both the real poles and the complex poles of the transfer function.

In a non-ideal filter (e.g., the passive filter 150), there may exist parasitic resistance, such that the parasitic resistors 160A and 160B each include a non-zero resistance. The transfer function of the non-ideal filter may be defined by the Equation 2 below:

$$H(s) = \frac{1}{\left(s + \frac{1}{RC}\right)\left(s^2 + s\frac{L + RR_pC}{LRC} + \frac{2R + R_p}{RLC}\right)} \quad \text{(Equation 2)}$$

In Equation 2, the variable s is the variable of the transfer function H(s), and is dependent on frequency of the system. The variable R is the resistance resulting from the resistors 152, (e.g., assuming that 152A, 152B, 152B, and 152D each have an equivalent resistances), the variable $R_p$ is the total of the parasitic resistance in the system (e.g., the resistance resulting from the parasitic resistors 160A and 160B), the variable C is the capacitance of the system (e.g., due to the capacitors 154A and 154B), and the variable L is the inductance of the system (e.g., due to the inductors 156A and 156B). The function $$\frac{1}{\left(s + \frac{1}{RC}\right)}$$

affects the real pole and is unchanged by the presence of the parasitic resistors 160A and 160B. The function $$\frac{1}{\left(s^2 + s\frac{L + RR_pC}{LRC} + \frac{2R + R_p}{RLC}\right)}$$

affects the complex pole and is affected by the presence of the parasitic resistors 160A and 160B. Similar to Equation 1, it may be appreciated that, as both functions of Equation 2 are affected by using different values for the resistors 152 and the capacitors 154A and 154B, changing the resistances for or capacitance values in the passive filter 150 affects both the real poles and the complex poles of the transfer function.

The real pole 252A and the complex poles 254A and 256A in the pole-zero map of FIG. 8 may result when the parasitic resistors 160A and 160B each have a resistance of 59Ω, the resistors 152 each have a resistance of at least 200Ω (e.g., 250Ω or more, 350Ω or more, 450Ω or more, 500Ω or more, such as 250Ω), the capacitors 154A and 154B each have a capacitance between 100 fF and 2 pF (e.g., 150 fF or more, 500 fF or more, 750 fF or more, 900 fF or more, 1 pF or more 1.5 pF or more, and so on, such as 1 pF), and the inductors 156A and 156B each have an inductance of 1 nH to 100 nH (e.g., 10 nH, 20 nH, 40 nH, 80 nH, and so on). The real pole 252A may be associated with the voltage response 260A, which may represent the voltage response across the passive filter 150 under the conditions associated with the real pole 252A. As may be observed, the voltage response 260A has an associated voltage droop 262A from the voltage 260D of an ideal passive filter.

The real pole 252B and the complex poles 254B and 256B may result when the parasitic resistors 160A and 160B each have a resistance of 59Ω, the resistors 152 each have a resistance of at least 200Ω (e.g., 250Ω or more, 350Ω or more, 450Ω or more, 500Ω or more, such as 250Ω), the capacitors 154A and 154B each have a capacitance between 100 fF and 2 pF (e.g., 150 fF or more, 500 fF or more, 750 fF or more, 900 fF or more, 1 pF or more 1.5 pF or more, and so on, such as 1.2 pF), and the inductors 156A and 156B each have an inductance of 1 nH to 100 nH (e.g., 10 nH, 20 nH, 40 nH, 80 nH, and so on). The real pole 252B may be associated with the voltage response 260B, which may represent the voltage response across the passive filter 150 and/or the amplification stage 151 under the conditions associated with the real pole 252B. As may be observed, the voltage response 260B has an associated voltage droop 262B from the voltage response 260D of an ideal passive filter.

The real pole 252C and the complex poles 254C and 256C may result when the parasitic resistors 160A and 160B each have a resistance of 59Ω, the resistors 152 each have a resistance of at least 200Ω (e.g., 250Ω or more, 350Ω or more, 450Ω or more, 500Ω or more, and so on, such as 400Ω)), the capacitors 154A and 154B include a capacitance between 100 fF and 2 pF (e.g., 150 fF or more, 500 fF or more, 750 fF or more, 900 fF or more, 1 pF or more 1.5 pF or more, and so on, such as 1 pF), and the inductors 156A and 156B each have an inductance of 1 nH to 100 nH (e.g., 10 nH, 20 nH, 40 nH, 80 nH, and so on). The real pole 252C may be associated with the voltage response 260C, which may represent the voltage response across the passive filter 150 and/or the amplification stage 151 under the conditions associated with the real pole 252C. As may be observed, the voltage response 260C has an associated voltage droop 262C from the voltage response 260D of an ideal passive filter.

The complex poles 254D and 256D may result from an ideal passive filter, when there is no parasitic resistance, the resistors 152 each have a resistance at least 200Ω (e.g., 250Ω or more, 350Ω or more, 450Ω or more, 500Ω or more, and so on, such as 250Ω), the capacitors 154A and 154B each have a capacitance of between 100 fF and 2 pF (e.g., 150 fF or more, 500 fF or more, 750 fF or more, 900 fF or more, 1 pF or more 1.5 pF or more, and so on, such as 1 pF), and the inductors 156A and 156B each have an inductance of 1 nH to 100 nH (e.g., 10 nH, 20 nH, 40 nH, 80 nH, and so on). As previously stated, the voltage response 260D may represent the voltage response across an ideal passive filter.

As mentioned above, the voltage responses 260A, 260B, and 260C, each have varying degrees of voltage droop 262A, 262B, and 262C, respectively, when compared to the expected voltage response of an ideal filter as illustrated by the voltage response 260D. To reduce or prevent excessive voltage droop 262, the passive filter 150 may be restructured such that certain components of the passive filter 150 may be tuned to adjust a complex pole of the transfer function while other components of the passive filter 150 may be tuned to adjust a real pole of the transfer function.

Figure 9:
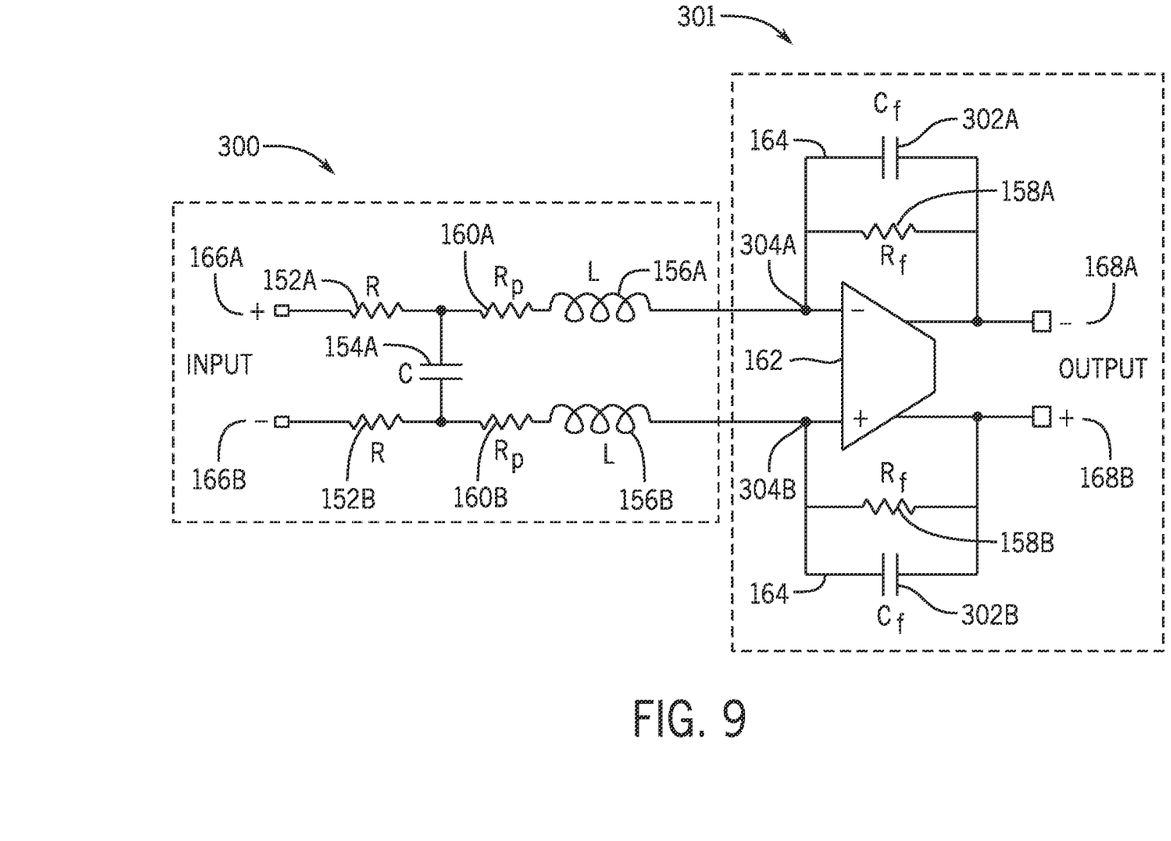
FIG. 9 is a circuit diagram of a passive filter and an active filter of the electronic device of FIG. 1 that enable adjustment of complex poles of a transfer function independent of real poles of the transfer function, and vice versa, according to embodiments of the present disclosure.

FIG. 9 is a circuit diagram of a passive filter 300 and an active filter 301 of the electronic device 10 of FIG. 1 that enables adjustment of complex poles independent of real poles, and vice versa, according to embodiments of the present disclosure. In some instances, the passive filter 300 and the active filter 301, in combination, may be referred to as passive/active hybrid filter circuitry. The passive filter 300 is electrically coupled to the active filter 301, and may be similar in structure to the passive filter 150 of FIG. 6, but without the resistors 152C and 152D and the capacitor 154B, such that the inductors 156A and 156B are directly coupled (i.e., without any intervening or intermediate components) to the amplifier 162 (e.g., wherein the amplifier 162 includes the amplification stage of the active filter 301). The active filter 301 includes feedback capacitors 302A and 302B coupled to the feedback chain 164 of (e.g., coupled in parallel to) the amplifier 162, such that the feedback resistor 158A and the feedback capacitor 302A are coupled in parallel with the amplifier 162 between a node 304A and the output port 168A, and the inductor 156A is coupled in series to the node 304A at a differential input of the amplifier 162. The active filter 301 includes the feedback resistor 158B and the feedback capacitor 302B coupled in parallel with the amplifier 162 between a node 304B and the output port 168B, and the inductor 156B is coupled in series to the node 304B at a differential input of the amplifier 162. Similar to the passive filter 150, the passive filter 300 may include the resistors 152A and 152B, the capacitor 154A, and the parasitic resistors 160A and 160B.

The behavior of the passive filter 300 may be defined by Equation 3 below:

$$H(s) = \frac{1}{\left(s + \frac{1}{R_f C_f}\right)\left(s^2 + s\frac{L + RR_p C}{LRC} + \frac{2R + R_p}{RLC}\right)} \quad \text{(Equation 3)}$$

In Equation 3, the variable s is a complex variable of the transfer function H(s), and varies proportionally to the frequency f of a signal (e.g., a signal provided to the passive filter 300). The variable R is the total of the resistance in the system resulting from the resistors 152 in the passive filter 300, the variable $R_p$ is the total of the parasitic resistance in the system (e.g., the resistance resulting from the parasitic resistors 160A and 160B), the variable C is the capacitance due to the capacitor 154A, the variable L is the inductance of the system (due to the inductors 154A and 154B), the variable $R_f$ is the total feedback resistance (i.e., the resistance in the active filter 301 due to the feedback resistors 158A and 158B), and the variable $C_f$ is the total feedback capacitance (i.e., the capacitance in the active filter 301 due to the feedback capacitors 302A and 302B).

The function $$\frac{1}{\left(s + \frac{1}{R_f C_f}\right)}$$

affects only the real pole, while the function $$\frac{1}{\left(s^2 + s\frac{L + RR_p C}{LRC} + \frac{2R + R_p}{RLC}\right)}$$

affects only the complex pole. As previously mentioned, the design of the passive filter 300 and the active filter 301 may enable adjustment of complex poles independent of real poles, and vice versa. For example, the real poles of the transfer function may be adjusted by choosing feedback capacitors 302A and 302B and/or feedback resistors 158A and 158B having various capacitance or resistance values, respectively, according to Equation 3. Likewise, the complex poles may be adjusted by choosing resistors 152A and 152B, the capacitor 154A, and/or the inductors 156A and 156B having various resistance, capacitance, or inductance values, respectively, according to Equation 3. This may enable adjusting the complex poles (e.g., by adjusting a quality factor of the complex poles) without moving the real poles along the real axis, thus reducing or avoiding the increased voltage droop observed in FIG. 8.

Figure 10:
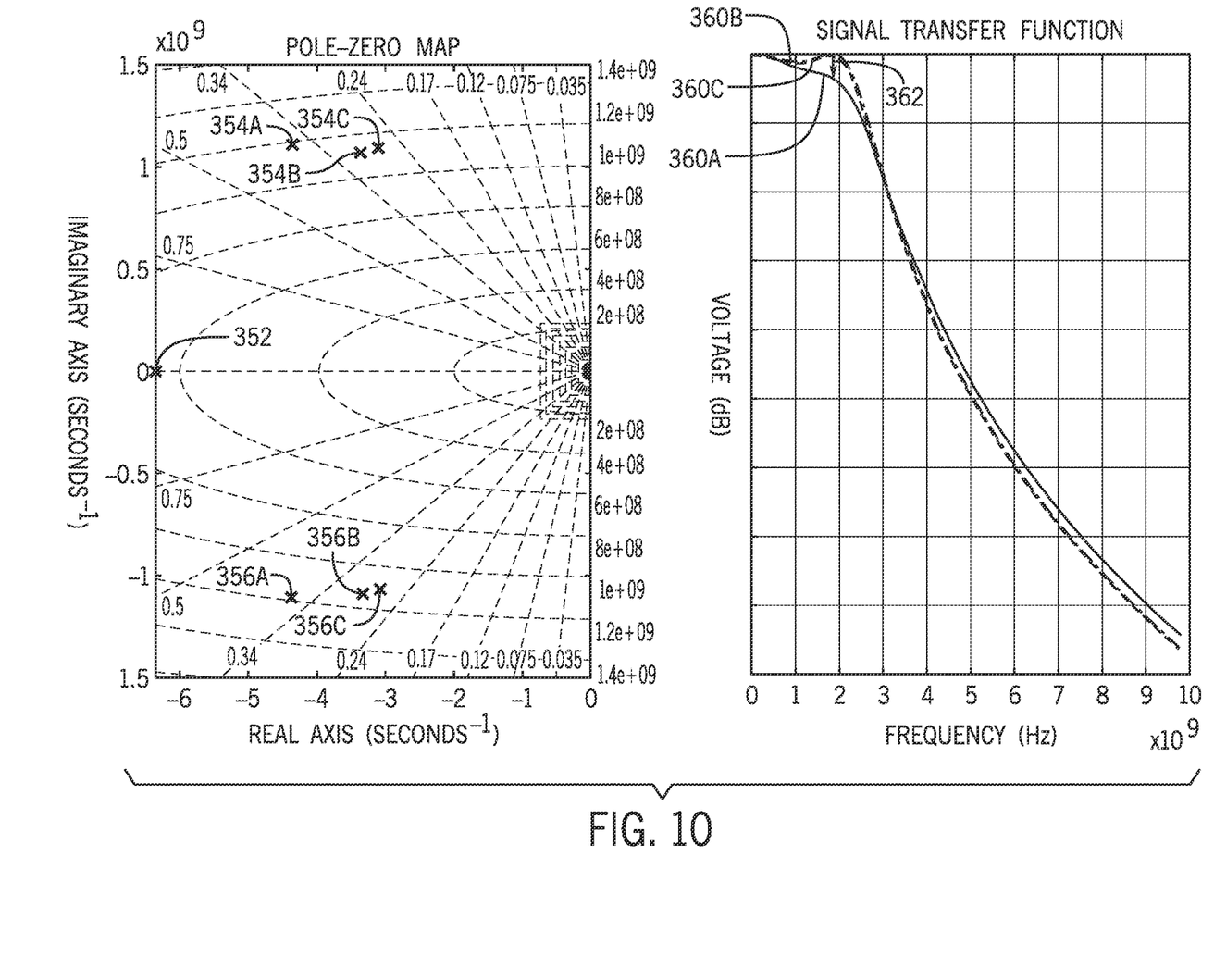
FIG. 10 includes a pole-zero map and a plot illustrating voltage responses varying with frequency for the passive filter of FIG. 9 in response to using various components in the passive filter of FIG. 9, according to embodiments of the present disclosure.

FIG. 10 includes a pole-zero map and a plot illustrating voltage responses 360A, 360B, and 360C (collectively referred to herein as the voltage responses 360) varying with frequency for the passive filter 300 in response to having different values for the components of the passive filter 300 and the active filter 301. A real pole 352 may result in the transfer function when the feedback resistors 158A and 158B each have a resistance of 400Ω or more (e.g., 450Ω or more, 500Ω or more, 1 kΩ or more, and so on, such as 400Ω), and the feedback capacitors 302A and 302B each have a capacitance between 100 fF and 2 pF (e.g., 150 fF or more, 500 fF or more, 750 fF or more, 900 fF or more, 1 pF or more 1.5 pF or more, and so on, such as 625 fF). As may be observed from the pole-zero map, the real pole 352 does not change position along the real axis, because various resistance values for the feedback resistors 158A and 158B and various capacitance values for the feedback capacitors 302A and 302B are not being used. The complex poles 354A, 354B, and 354C and the complex poles 356A, 356B, and 356C, however, are being adjusted by varying values of the components not in the feedback loop of the active filter 301 (e.g., the resistors 152A and 152B, the capacitor 154A, or the inductors 156A and 156B).

The plot includes the voltage responses 360A, 360B, and 360C. The voltage response 360A is associated with the complex poles 354A and 356A, the voltage response 360A representing the voltage response across an ideal filter including a parasitic resistance. For example, the positions of the complex poles 354A and 356A may occur when the resistors 152A and 152B each have a resistance of at least 200Ω (e.g., 250Ω or more, 350Ω or more, 450Ω or more, 500Ω or more, and so on, such as 250Ω), the capacitor 154A has a capacitance between 100 fF and 2 pF (e.g., 150 fF or more, 500 fF or more, 750 fF or more, 900 fF or more, 1 pF or more 1.5 pF or more, and so on, such as 1 pF), the inductors 156A and 156B each have an inductance of 1 nH to 100 nH (e.g., 10 nH, 20 nH, 40 nH, 80 nH, and so on), and the parasitic resistors 160A and 160B each have a resistance of 1Ω to 100Ω (e.g., 10Ω or more, 25Ω or more, 50Ω or more, 59Ω or more, 75Ω or more, and so on).

The voltage response 360B is associated with the complex poles 354B and 356B, the voltage response 360B representing the voltage response across the passive filter 300 and the active filter 301 including the parasitic resistors 160A and 160B. For example, the positions of the complex poles 354B and 356B may occur when the resistors 152A and 152B each have a resistance of at least 200Ω (e.g., 250Ω or more, 350Ω or more, 450Ω or more, 500Ω or more, and so on, such as 400Ω), the capacitor 154A has a capacitance of between 100 fF and 2 pF (e.g., 150 fF or more, 500 fF or more, 750 fF or more, 900 fF or more, 1 pF or more 1.5 pF or more, and so on, such as 1.09 pF), the inductors 156A and 156B each have an inductance of 1 nH to 100 nH (e.g., 10 nH, 20 nH, 40 nH, 80 nH, and so on), and the parasitic resistors 160A and 160B each have a resistance of 1Ω to 100Ω (e.g., 10Ω or more, 25Ω or more, 50Ω or more, 59Ω or more, 75Ω or more, and so on).

The voltage response 360C is associated with the complex poles 354C and 356C, the voltage response 360C representing the voltage response across an ideal passive filter without parasitic resistances. For example, the positions of the complex poles 354A and 356A may occur when the resistors 152A and 152B each have a resistance of at least 200Ω (e.g., 250Ω or more, 350Ω or more, 450Ω or more, 500Ω or more, and so on, such as 400Ω), the capacitor 154A has a capacitance of between 100 fF and 2 pF (e.g., 150 fF or more, 500 fF or more, 750 fF or more, 900 fF or more, 1 pF or more 1.5 pF or more, and so on, such as 1.09 pF), the inductors 156A and 156B each have an inductance of 1 nH to 100 nH (e.g., 10 nH, 20 nH, 40 nH, 80 nH, and so on), and there is no parasitic resistance (e.g., the parasitic resistors 160A and 160B each have a resistance of 0 ohms).

As may be observed from the plot of FIG. 10, the voltage response 360A has an associated voltage droop 362 from the voltage response 360C of the ideal active/passive filter. The voltage response 360B of the passive filter 300 may be similar or identical to the voltage response 360C of the ideal filter, and may have no voltage droop or a voltage droop less than an ideal filter including parasitic resistance (e.g., as represented by the voltage response 360A). As such, it may be appreciated that the passive filter 300 and the active filter 301, by enabling adjustment of the real pole and the complex poles independently of each other, may achieve enhanced and improved behavior over alternative filter designs.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. Receiver filter circuitry, comprising:
an amplifier;
a first inductor coupled to a first input port of the receiver filter circuitry and a first amplifier input port of the amplifier, wherein no capacitors are directly coupled in series to the first amplifier input port;
a second inductor coupled to a second input port of the receiver filter circuitry and a second amplifier input port of the amplifier, wherein no capacitors are directly coupled in series to the second amplifier input port;
a first capacitor coupled to the first input port and the second input port;
a second capacitor coupled to the first amplifier input port and a first amplifier output port of the amplifier;
a first resistor coupled to the first amplifier input port and the first amplifier output port;
a third capacitor coupled to the second amplifier input port and a second amplifier output port of the amplifier; and
a second resistor coupled to the second amplifier input port and the second amplifier output port.

2. The receiver filter circuitry of claim 1, wherein the first inductor, the second inductor, and the first capacitor are configured to adjust a complex pole of a transfer function associated with the receiver filter circuitry.

3. The receiver filter circuitry of claim 1, wherein the first resistor, the second capacitor, the second resistor, and the third capacitor are configured to adjust a real pole of a transfer function associated with the receiver filter circuitry.

4. The receiver filter circuitry of claim 1, comprising a third resistor coupled in series between the first inductor and the first input port of the receiver filter circuitry and a fourth resistor coupled in series between the second inductor and the second input port of the receiver filter circuitry.

5. The receiver filter circuitry of claim 4, wherein the third resistor and the fourth resistor are configured to adjust a complex pole of a transfer function associated with the receiver filter circuitry.

6. The receiver filter circuitry of claim 4, wherein the first capacitor is coupled to the first input port between the third resistor and the first inductor and is coupled to the second input port between the fourth resistor and the second inductor.

7. The receiver filter circuitry of claim 4, wherein the third resistor and the fourth resistor each comprise a resistance of at least 200 ohms.

8. The receiver filter circuitry of claim 1, wherein the first inductor, the second inductor, or both each comprise an inductance of 1 nanoHenry to 100 nanoHenries.

9. The receiver filter circuitry of claim 1, wherein the second capacitor, the third capacitor, or both each comprise a capacitance of 100 femtoFarads to 2 picoFarads.

10. An electronic device, comprising:
one or more antennas;
a transmitter coupled to the one or more antennas; and
a receiver coupled to the one or more antennas, the receiver comprising filter circuitry comprising
an amplifier,
a first inductor and a first resistor coupled in series to a first input port of the filter circuitry, the first inductor and the first resistor are configured to adjust a complex pole of the filter circuitry,
a second inductor and a second resistor coupled in series to a second input port of the filter circuitry, the second inductor and the second resistor configured to adjust the complex pole of the filter circuitry,
a first capacitor coupled in parallel to the first input port and the second input port, the first capacitor configured to adjust the complex pole of the filter circuitry;
a third resistor coupled in parallel to the amplifier, the third resistor configured to adjust a real pole of the filter circuitry,
a second capacitor coupled in parallel to the third resistor and the amplifier, the second capacitor configured to adjust the real pole of the filter circuitry;
a fourth resistor coupled in parallel to the amplifier, the fourth resistor configured to adjust the real pole of the filter circuitry; and
a third capacitor coupled in parallel to the fourth resistor and the amplifier, the third capacitor configured to adjust the real pole of the filter circuitry.

11. The electronic device of claim 10, wherein the first capacitor comprises a capacitance of 100 femtoFarads to 2 picoFarads.

12. The electronic device of claim 10, wherein the second capacitor comprises a capacitance of 100 femtoFarads to 2 picoFarads.

13. The electronic device of claim 10, wherein the third capacitor comprises a capacitance of 100 femtoFarads to 2 picoFarads.

14. The electronic device of claim 10, wherein the first inductor, the second inductor, or both, each comprises an inductance of 1 nanoHenry to 100 nanoHenries.

15. A transceiver filter circuit, comprising:
an amplifier;
a first resistor coupled in series to a first input port of the transceiver filter circuit;
a second resistor coupled in series to a second input port of the transceiver filter circuit;
a first capacitor coupling the first resistor and the second resistor;

a first inductor coupled to the first resistor and directly coupled to a first differential input of the amplifier;

a second capacitor and a third resistor coupled in parallel to the first differential input and a first differential output of the amplifier;

a second inductor coupled to the second resistor and directly coupled to a second differential input of the amplifier; and a third capacitor and a fourth resistor coupled in parallel to the second differential input and a second differential output of the amplifier.

16. The transceiver filter circuit of claim 15, wherein the first inductor, the second inductor, or both each comprise an inductance of 1 nanoHenry to 100 nanoHenries.

17. The transceiver filter circuit of claim 15, wherein the first inductor, the first resistor, and the first capacitor are configured to adjust a quality factor of a complex pole of a transfer function associated with the transceiver filter circuit.

18. The transceiver filter circuit of claim 15, wherein the second capacitor, the third capacitor, or both each comprise a capacitance of 100 femtoFarads to 2 picoFarads.

19. The transceiver filter circuit of claim 15, wherein the second inductor, the second resistor, the second capacitor, or any combination thereof is configured to adjust a quality factor of a complex pole of a transfer function associated with the transceiver filter circuit.

20. The transceiver filter circuit of claim 15, wherein the second capacitor, the third capacitor, the third resistor, the fourth resistor, or any combination thereof, is configured to adjust a real pole of a transfer function associated with the transceiver filter circuit.

* * * * *